United States Patent [19]
Kim et al.

[11] Patent Number: 5,319,218
[45] Date of Patent: Jun. 7, 1994

[54] PULSE SHARPENING USING AN OPTICAL PULSE

[75] Inventors: Anderson H. Kim, Toms River; Maurice Weiner, Ocean, both of N.J.; Louis J. Jasper, Jr., Fulton, Md.; Robert J. Youmans, Brick, N.J.

[73] Assignee: The United States of America as represented by the Secretary of the Army, Washington, D.C.

[21] Appl. No.: 61,612

[22] Filed: May 6, 1993

[51] Int. Cl.$^5$ .......................... H01L 27/14
[52] U.S. Cl. .......................... 257/1; 257/4; 257/82; 257/459; 257/98; 385/49; 250/214.1
[58] Field of Search .......... 257/459, 81, 82, 80, 257/457, 1, 2, 3, 448, 4, 5, 98, 432; 250/214.1; 385/49

[56] References Cited

U.S. PATENT DOCUMENTS

| | | | |
|---|---|---|---|
| 3,450,885 | 6/1969 | Willes | 257/459 X |
| 3,795,803 | 3/1974 | Ancker-Johnson | 257/1 X |
| 3,921,191 | 11/1975 | Merrin | 257/2 X |
| 4,240,088 | 12/1980 | Myers | 257/82 X |
| 5,028,971 | 7/1991 | Kim et al. | 257/459 |
| 5,149,957 | 5/3182 | Pierce et al. | 250/214.1 |
| 5,227,621 | 7/1993 | Kim et al. | 257/459 X |

Primary Examiner—William Mintel
Attorney, Agent, or Firm—Michael Zelenka; James A. Digiorgio

[57] ABSTRACT

A photoconductive ultra-wideband impulse generating device utilizing pulse sharpening techniques to further increase its radiation frequency well above the gigahertz range while also substantially improving radiation efficiency. Such pulse sharpening provides for a radiator having a wider range of applications.

1 Claim, 2 Drawing Sheets

PULSE SHARPENING USING AN OPTICAL PULSE

GOVERNMENT INTEREST

The invention described herein may be manufactured, used, and licensed by or for the Government of the United States of America for governmental services without the payment to us of any royalty thereon.

FIELD OF THE INVENTION

This invention relates generally to pulse power technology and more particularly to optical pulse-sharpening of sub-nanosecond, high peak pulse generators used in devices such as impulse radar apparatus, active electromagnetic signal jammers, and high power microwave (HPM) weapon systems.

BACKGROUND OF THE INVENTION

In recent years there has been active research in the area of nanosecond-type pulse generation. Such research has produced GaAs substrate high power storage devices that utilize photoconductive solid state switching to generate nanosecond-type pulses. One such switch, disclosed in U.S. Pat. No. 5,028,971, issued to Anderson H. Kim et al on Jul. 2, 1991, entitled, "High Power Photoconductor Bulk GaAs Switch" is incorporated herein by reference.

The "Bulk GaAs Switch" is basically an electrical energy storage device comprised of two mutually opposite gridded electrodes positioned on opposite surfaces of a GaAs semiconductor substrate such that a power supply means can provide an electric field in a predetermined direction across the patterned electrodes. The device is photoconductively activated to discharge its stored energy when it receives light radiation at a predetermined wavelength. When light energy penetrates the substrate region it generates electron/hole pairs which cause the electrical resistance of the semiconductor material to decrease. As a result, the stored electrical energy will instantaneously discharge through a load.

It is widely recognized that when such devices discharge they radiate pulses in a direction perpendicular to the substrate surface. The bandwidth of such pulses is determined and/or limited by the speed with which the device discharges and recovers. As the pulsewidth narrows, the bandwidth increases. Consequently, those skilled in the art widely recognize the benefits of a device that generates a narrow pulsewidth.

The critical elements in generating such narrow pulsewidths are the construction of the energy storage device (shape, size, etc.) and the effectiveness of the photoconductive switching. Heretofore, two general techniques have been used to generate such narrow pulsewidth (ultra-wideband) radiation.

The first technique utilizes the recombination property of the semiconductor material from which the switch itself is fabricated. This technique (using photoconductive GaAs switches), however, typically generates a signal with a long pulsewidth due to a relatively long recovery time. The long recovery time is attributed to the inherent properties of gallium arsenide, including: (1) the substantially long recombination time and (2) the switch lock-on phenomena. As such, this technique is not desirable for generating ultra-wideband pulses.

The second technique utilizes an energy storage element which is comprised of either a short section of transmission line or a capacitor. The energy storage element is photoconductively triggered to instantaneously discharge all or substantially most of its stored energy to an impedance load. As with the aforementioned technique, the extended recovery time inherent in photoconductive switches prevents this device from producing extended wideband radiation.

A major breakthrough in this pulsewidth problem, however, was presented in the inventors copending patent application entitled "Ultra-Wideband High Power Photon Triggered Frequency Independent Radiator," Ser. No. 07/946,718, filed by Kim et al, Sep. 18, 1992 and incorporated herein by reference. This frequency radiator combines an energy storage function and an antenna radiating function into one structure to create an ultra wideband frequency radiator capable of generating pulses with a range of frequency components from hundreds of megahertz to several gigahertz. Basically, this radiator utilizes two identical quasi-radial transmission line structures to store electric energy while it implements photoconductive switching to trigger the instantaneous discharge of the stored energy to generate the desired ultra wideband RF radiation.

Such an energy storage device comprises a dielectric storage medium, two quasi-radially shaped, metalized electrodes mounted opposite one another on the top surface of the dielectric storage medium and a metalized electrode mounted on the bottom surface of the dielectric medium. A photoconductive switch, centrally located on the dielectric between the two quasi-radially shaped electrodes, connects the two quasi-radially shaped electrodes to the bottom electrodes through a load impedance. When the switch is activated by light radiation, the stored energy discharges through the load impedance generating a sub-nanosecond-type pulse.

Although such a device provides for fast rise-time pulses, the radiation bandwidth is limited by the trigger speed of the photoconductive switch and the recovery time of the GaAs substrate. One method of breaking through these physical limits and thus increasing the radiation bandwidth is by sharpening the discharge pulse. A sharpened pulse is a fast rise-time as well as fast fall-time pulse. Consequently, those skilled in the art recognize and desire the bandwidth benefit resulting from an Rf radiator that incorporates pulse sharpening techniques.

SUMMARY OF THE INVENTION

Accordingly, the general purpose of this invention is to utilize a pulse sharpening technique to provide a radiator that generates ultra wideband RF radiation. This object is achieved by utilizing an optical means to trigger the energy discharge of a semi-insulating GaAs energy storage substrate and to abruptly terminate that discharge after a predetermined interval of time. The abrupt shutdown sharpens the discharged pulse of such a device and increases the radiation bandwidth.

Pulse sharpening effectively shifts the center frequency of the output pulse so that the frequency spectrum window is substantially extended above a gigahertz while the device's radiation efficiency is substantially improved. The net result is a device capable of a wider range of applications.

In a preferred embodiment, the invention is comprised of a monolithic, photoconductive impulse generating device having metalized electrodes on two opposing surfaces. A laser light source is optically connected to each surface through a fiber optic cable wherein the cable leading to one surface differs in length from the cable leading to the other surface by some predetermined amount. As such, light energy passing through the longer cable will arrive at its respective surface at some predetermined time after the light passing through the shorter cable. Consequently, the energy discharge that is triggered by the light passing through the shorter cable will be abruptly terminated by the light passing through the longer cable.

DETAILED DESCRIPTION OF THE INVENTION

Figure 1:
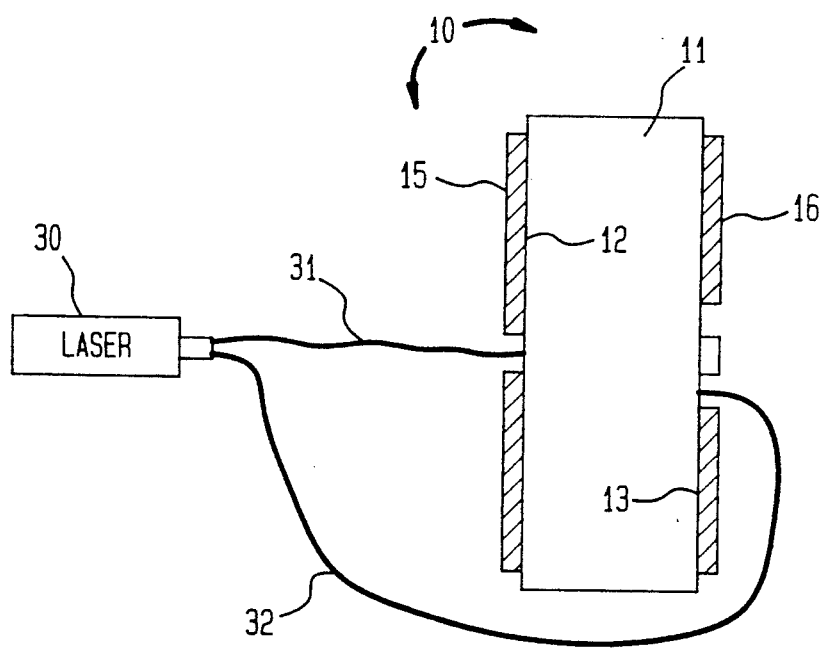
FIG. 1 is a side pictorial view of the preferred embodiment showing an optical means for pulse sharpening using a laser source and two fiber cables differing in length by a predetermined quantity.

Referring now to the drawing there is shown in FIG. 1 a monolithic, photoconductive impulse generator 10 optically coupled to laser 30 through fiber optic cables 31 and 32.

Figure 2A:
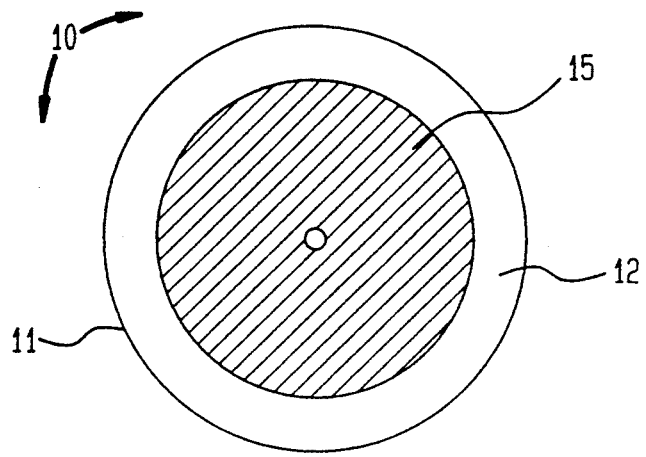
FIG. 2a is a top pictorial view of the preferred embodiment shown in FIG. 1.
Figure 2B:
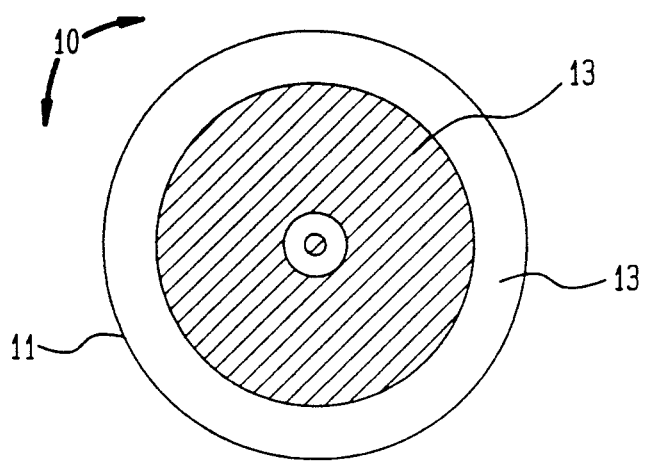
FIG. 2b is a bottom pictorial view of the preferred embodiment shown in FIG. 1.
Figure 2C:
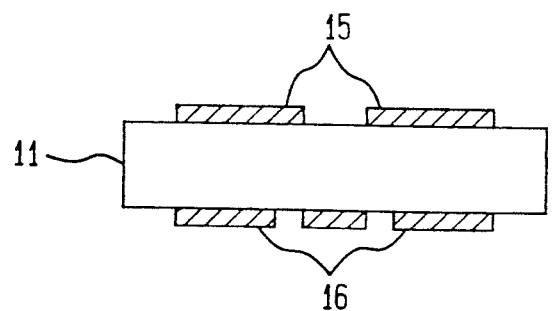
FIG. 2c is a side pictorial view of the preferred embodiment shown in FIG. 1.

Device 10 is comprised of photoconductive semiconductor substrate 11 which has a top and bottom surface 12 and 13, respectively (see FIGS. 2a-2c). Top surface 12 has metalized electrode 15 resting on its surface whereas bottom surface 13 has metalized electrode 16 resting on its surface. Electrodes 15 and 16 are positioned such that they can be electrically charged by a power supply means (not shown) and provide the energy storage capability of generator 10. Laser 30 is optically coupled to surfaces 12 and 13 of generator 10 through fiber cables 31 and 32, respectively. Cable 31, leading to top surface 12, is shorter than cable 32, leading to bottom surface 13, by some predetermined length. As such, light energy from laser 30 will reach surface 13 at some predetermined time after it reaches surface 12. Consequently, light energy reaching surface 12 will trigger device 10 to discharge its stored energy whereas the light energy reaching surface 13 will terminate that discharge at some predetermined time later.

This action of triggering and abruptly terminating energy discharge sharpens the pulse generated by device 10 so that it has fast-rise-time as well as fast-fall-time characteristics. As such, device 10 will radiate energy over an ultra-wideband of frequencies.

What is claimed is:

1. A photoconductive ultra-wideband impulse generating device, comprising:

a semiconductor substrate having at least two opposing surfaces each having a metalized electrode positioned such that electrostatic energy can be stored thereon;

a power supply means for applying an electric field in a predetermined direction across aid electrodes such that said power is stored on said metalized electrodes; and an optic means for triggering the discharge of said stored energy and abruptly terminating said discharge after a predetermined interval of time, said optic means comprising a laser source optically coupled to each said surface electrode through a separate fiber cable, each said fiber cable having a different predetermined length such that light energy from said laser source passes through the shorter fiber cable to trigger said discharge and said light energy passes through said longer cable to terminate said discharge at a predetermined interval of time later.

* * * * *